United States Patent
Gupta et al.

(10) Patent No.: US 7,454,722 B2
(45) Date of Patent: Nov. 18, 2008

(54) ACYCLIC MODELING OF COMBINATIONAL LOOPS

(75) Inventors: Amit Gupta, Waltham, MA (US); Charles W. Selvidge, Wellesley, MA (US)

(73) Assignee: Mentor Graphics Corporation, Wilsonville, OR (US)

( * ) Notice: Subject to any disclaimer, the term of this patent is extended or adjusted under 35 U.S.C. 154(b) by 395 days.

(21) Appl. No.: 11/068,036

(22) Filed: Mar. 1, 2005

(65) Prior Publication Data

US 2006/0123300 A1    Jun. 8, 2006

Related U.S. Application Data

(60) Provisional application No. 60/627,172, filed on Nov. 15, 2004.

(51) Int. Cl.
*G06F 17/50* (2006.01)
(52) U.S. Cl. .............................. 716/3; 716/18
(58) Field of Classification Search ...... 716/1, 716/3, 18
See application file for complete search history.

(56) References Cited

U.S. PATENT DOCUMENTS 6,009,531 A * 12/1999 Selvidge et al. ............. 713/400

7,246,331 B2 * 7/2007 Ward ........................... 716/4

OTHER PUBLICATIONS

Ronald L. Rivest. The necessity of feedback in minimal monotone combinational circuits. In *IEEE Transactions on Computers*, 26, 6 (1977).
Thomas R. Shilpe, Gerard Berry and Herve Tousti. Constructive analysis of cyclic cicuits. In *Proceedings of European Design and Test Conference*, pp. 328-333, Paris France, Mar. 1996.
Thomas R. Shilpe, Vigyan Singhal, Robert K. Brayton, and Alberto L. Sangiovanni-Vincentelli. Analysis of combinational cycles in sequential circuits. In *Proceedings of the International Symposium on Circuits an Systems (ISCAS)*, vol. IV, pp. 592-595, May 1996.
S. Malik. Analysis of cyclic combinational circuits. *In IRRR Trans. Computer-Aided Design*, pp. 950-956, Jul. 1994.

(Continued)

*Primary Examiner*—Vuthe Siek
(74) *Attorney, Agent, or Firm*—Banner & Witcoff, Ltd.

(57) ABSTRACT

Aspects of the present invention are directed to converting non-oscillatory combinational loops into acyclic circuits. Combinational loops may be modeled as state-holding elements where non-oscillatory loops are broken using edge-sensitive latches. In addition to providing a way to model combinational loops originally consisting only of gates (i.e., without originally including any state-holding elements), loops that have paths through user latches may also be converted. The presented methodology may be used with both small and large loops.

15 Claims, 4 Drawing Sheets

OTHER PUBLICATIONS

Stephan A. Edwards. Making cyclic circuits acylic. In *Proceedings of the 40th Design Automation Conference (DAC)*, pp. 159-162, Jun. 2-6, 2003.

Denis Hommais and Frederic Petrot. Efficient combinational loops handling for cycle precise simulation of system on chips. In *Proceedings of the 24th EUROMICRO International Conference on Digital Systems*, pp. 51-54, vol. 1 IEEE Computer Society Press, 1998.

F. Bourdoncle. Efficient chaotic iteratuib strategies with widening, In *Proceedings of the International Conference on Formal Methods in Programming and their Applications*, vol. 735 *of Lecture Notes in Computer Science*, pp. 128-141. 1993.

T. Cormen, C. Leiserson, R. Rivest, and C. Stein. In *Introduction to algorithms. The MIT Press*, second edition, 2001, Chapter-21.

* cited by examiner

```
Function check_monotonic_lut()
Input <Array> TruthTable; Input numInputs; Input inIdx;
1. For (i = 0; i < TruthTable.Num(); i++)
2.    Int inIdxZero = TruthTable[i & ~(1 << inIdx)];
3.    Int inIdxOne = TruthTable[i | (1 << inIdx)];
4.    If(inIdxZero == inIdxOne) continue;
5.    If(inIdxZero == 0) propagate_non_inverted;
6.    If(inIdxZero == 1) propagate_inverted;
EndFor
If(both propgate_inverted and propagate_non_inverted)
    Return False;
Return True; And Return propagate inverted or not.
```

ACYCLIC MODELING OF COMBINATIONAL LOOPS

RELATED APPLICATIONS

This application claims priority to U.S. provisional patent application Ser. No. 60/627,172, filed Nov. 15, 2004, incorporated herein by reference as to its entirety.

FIELD OF THE INVENTION

Aspects of the present invention are directed to the acyclic modeling of combinational loops in circuit designs.

BACKGROUND

Traditionally, circuits with combinational loops are found only in asynchronous designs. Combinational loops also arise in synchronous circuits as a result of automated synthesis tools converting an RTL-level description to a gate level description. In some cases, combinational loops are synthesized intentionally by a synthesis compiler for area optimization. However, combinational loops in designs are always undesirable. A combinational loop or feedback path implies a mutual dependence of a signal on itself with zero delay. Zero delay semantics necessitate special handling in designing cycle-accurate simulators or statically scheduled emulators.

In general, combinational loops breach design methodologies because they typically involve undesirable and unpredictable circuit behavior and can lead to oscillations based on the external stimuli to the loops. For designs compiled using automated synthesis-compilers, these loops are very likely to appear in generated gate-level designs. Although designs containing combinational loops can potentially save physical space when embodied in hardware, these loops are extremely difficult to manipulate in static scheduling, timing analysis, and logic minimization. Ideally, all dependencies between different signals should be known explicitly at compile time, and the value of each signal should be exclusive of its own non-delayed value.

Attempts have been made to solve the problem of combinational loops. In one approach, combinational loop analysis uses binary decision diagrams (BDDs) to detect whether a sequential circuit with combinational loops exhibits standard synchronous behavior. If so, an equivalent circuit without combinational loops is produced. In this approach, a fixed-point iteration method is used where all acyclic fragments are generated from a combinational loop that produces a well-behaved zero or one value at the output(s) of the loop. The construction of such fragments is performed using BDDs, and if all the outputs are evaluated to be stable, the BDDs are composed to form the equivalent circuit.

In another approach, it is assumed that all internal nodes are set to X (i.e., undefined), and that each of these nodes should resolve such that every combinational loop output in the circuit will be set to either a stable 0 or a stable 1. This analysis works by building all partial assignments to the inputs of the combinational loop, resulting in non-X values being assigned to the outputs of the loops. The acyclic circuit is then constructed by joining together all the partial assignment circuits, generated in the analysis. However, because this approach uses a potentially exponential algorithm, it is practical only for smaller loops.

In conventional commercial verification tools, such as cycle-precise software simulators or statically scheduled emulators, the zero delay semantic is handled by inserting a finite state machine (FSM) in a combinational loop that stalls simulation time until the outputs of the loop become stable. Another method, used in statically scheduled emulators, is to insert pipeline flops in the feedback path of a combinational loop in order to stabilize the loop output values. Such emulators force loops to become localized on a single reconfigurable chip, such as a single field-programmable gate array (FPGA). This prevents cross-chip communications from having any self-dependencies. However, multiple pipelining of a loop can cause the loop to exhibit analog behaviors, often resulting in the oscillation of otherwise non-oscillatory loops.

SUMMARY OF THE INVENTION

Aspects of the present invention are directed to converting non-oscillatory combinational loops into acyclic circuits. Combinational loops may be modeled as state-holding elements where non-oscillatory loops are effectively broken using edge-sensitive latches. In addition to providing a way to model combinational loops originally consisting only of gates (i.e., without originally including any state-holding elements), loops that have paths through user latches may also be successfully converted. Any increase in design area that may be realized by loop conversion has an upper bound of twice the size of the original loop. In addition, the loop transformation methodology has a time complexity that is linear with respect to loop size. Thus, the presented methodology works well with both small and large loops.

Accordingly, circuit designers may feel as though they have more freedom in their designs, because designers need not be as concerned about whether loops may be synthesized. This means that designers may be more likely to design circuits at a high level the way that the designers actually intend them. This also means that the design process may be faster and more efficient as there is now one less restriction on the designer.

These and other aspects of the invention will become apparent to one of ordinary skill in the art upon a reading of the following description, drawings, and the claims.

BRIEF DESCRIPTION OF THE DRAWINGS

The foregoing summary of the invention, as well as the following detailed description of illustrative embodiments, is better understood when read in conjunction with the accompanying drawings, which are included by way of example, and not by way of limitation with regard to the claimed invention.

DETAILED DESCRIPTION OF ILLUSTRATIVE EMBODIMENTS

Figure 1:
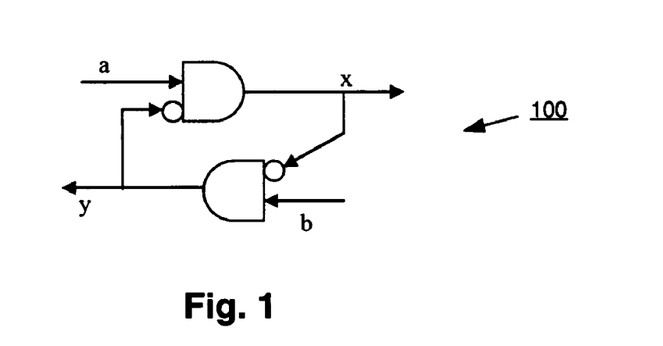
FIG. 1 is a schematic diagram of an illustrative non-oscillatory combinational loop.

Aspects of the present invention may be viewed as improvements to previous methodologies, although a completely different analysis is used. An improvement lies in the fact that previous methodologies assert that the combinational loop 100 shown in FIG. 1, for example, is convertible to a non-loop equivalent unless a=b=1. However, in accordance with aspects of the present invention, combinational loop 100 is determined to be a "safe" loop that can be converted to a non-loop equivalent. This is because where a=b=1 in this example, then both x and y hold their previous values and a state-holding element such as a latch may be used to model x and y as an acyclic circuit.

1.0 Modeling Combinational Loops

Aspects of the present invention provide a compelling computer-implemented solution to modeling combinational loops as acyclic circuit in gate level designs. An efficient and linear-time solution is provided that detects the fixed-point behavior of combinational loops in gate-level designs and converts combinational loops into acyclic paths. The solution is based on the following observation. The output of a combinational loop can be modeled as a state holding element, which has the following properties:

- for some set of values of the non cyclic inputs to a loop, the state of the output of the loop is computed independent of its own value; and
- in all other cases, the output state of the loop will either hold its previous value or oscillate for infinite duration.

Thus, all feedback paths in a cyclic combinational loop are analyzed to match the two properties mentioned above. The semantics of the two properties listed above may be modeled using a state-holding element such as an edge-sensitive latch. The feedback path may thus be transformed into an acyclic path using an edge-sensitive latch as a state-holding element. At the same time, the original functionality of the circuit is preserved with the transformation. This solution is not only capable of handling loops through purely combinational logic units such as AND, OR, and INVERTER gates, but also loops that have flow paths from the data input of one or more edge-sensitive user latches to their outputs. This transformation does not require the use of a finite state machine (FSM), a stall mechanism, or retiming. Moreover, the transformed circuit is functionally equivalent to the original circuit.

2.0 Preliminaries

Figure 2:
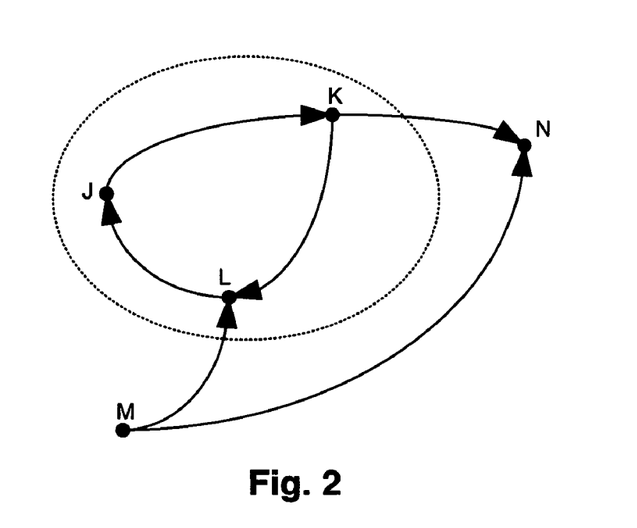
FIG. 2 is a node diagram including an illustrative Strongly Connected Component.

A combinational loop structure may contain multiple feedback paths, commonly known as parallel loops or nested loops. In other words, a Strongly Connected Component (SCC) of combinational units in a design may contain multiple feedback paths. An SCC is a term commonly used to refer to a maximal set of components that can all reach each other. For example, FIG. 2 shows a structure having nodes J, K, L, M, and N, directionally interconnected as shown. The SCC in this example consists of nodes J, K, and L (indicated by a broken line enclosure), because each of these nodes can reach each other. However, M and N are each not part of the SCC because M cannot be reached from {J,K,L} and N cannot reach {J,K,L}.

The transformation described herein converts different feedback paths contained in an SCC, one at a time. Since the functionality of each signal in a feedback path is preserved in the transformation, the order in which different feedback paths are converted does not affect the functionality of the circuit. For the purposes of this disclosure, "feedback path" and "combinational feedback path" are the same, unless otherwise explicitly stated.

2.1 Non-Oscillatory Feedback Paths

Figure 3:
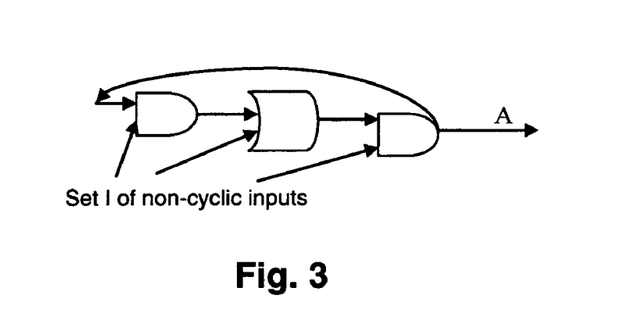
FIG. 3 is a schematic diagram of another illustrative combinational loop.

In this section, criteria are described for a non-oscillatory feedback path. An output of a feedback path may be described as a Sum of Product (SOP) form of the non-cyclic inputs and the output itself. The SOP form contains different clauses, and the output of the feedback path may be one of the literals in the SOP form. For an arbitrary loop such as shown in FIG. 3, the output function of signal may be written as:

$$A = F(I).A + G(I).Inv(A) + B(I) \qquad \text{Equation 1,}$$

wherein $F(I)$, $G(I)$ and $B(I)$ are functions of non-cyclic inputs to the feedback path, a dot (.) denotes the AND operation, a plus sign (+) denotes the OR operation, $Inv(\ )$ denotes the negation operation, and $I$ is the set of all non-cyclic inputs to the feedback path.

Figure 4:
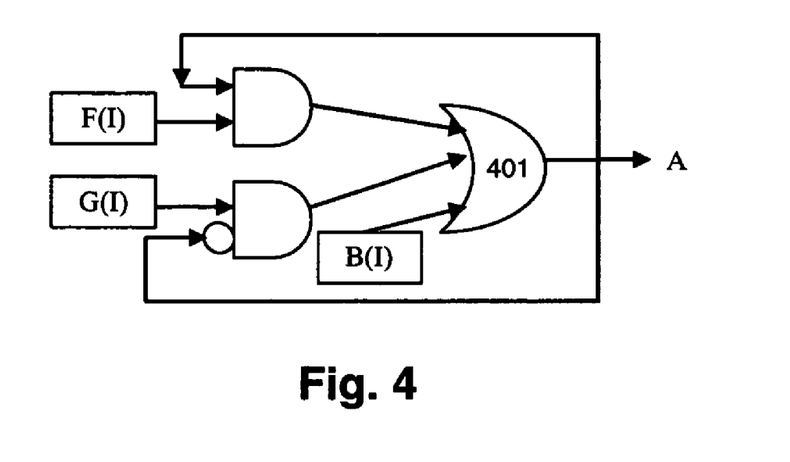
FIG. 4 is a schematic diagram of an illustrative combinational loop having multiple feedback paths.

Assuming for the moment that both $F(I)$ and $G(I)$ are non-zero, the feedback path may be broken into two overlapping feedback paths. This is illustratively shown in FIG. 4. For the feedback path through $G(I)$, and when $G(I)$ forms the controlling path to OR gate 401, the loop may be considered to be possibly oscillatory. This is because, when $G(I)$ evaluates to true and $F(I)$ and $B(I)$ each evaluates to false based on some values of input set $I$, the result would be $A=Inv(A)$, meaning that the loop would oscillate forever.

Based on the above analysis, the methodology would only convert those feedback loops of the form:

$$A = F(I).A + B(I) \qquad \text{Equation 1(a).}$$

And, a static non-zero evaluation of $G(I)$ defines criteria for a possibly oscillatory feedback loop. Thus, aspects of the present invention may be applied to non-oscillating loops, and Equation 1(a) forms the basis function as the input to the algorithm.

2.2 Mutual Exclusiveness in Monotonic Loops

The logic in Equation 1(a) may be converted so as to have the property that the function controlling the propagation of A to the output is mutually exclusive to the function independent of A. Thus, $$A = F(I).A + B(I)$$

$$A = (F(I).(Inv(B(I) + B(I)))).A + B(I)$$

$$A = (F(I).Inv(B(I)).A + B(I)(1 + F(I).A)$$

$$A = (F(I).Inv(B(I))).A + B(I)$$

$$A = F1(I).A + B(I) \qquad \text{Equation 2,}$$

where $F1(I) = F(I).Inv(B(I))$.

Function $F1(.)$ is mutually exclusive to function $B(.)$. This denotes an important property of the non-oscillating feedback loop, since when $F1(.)$ is true, $B(.)$ must be false and Equation 2 reduces to $A=A$. However, when $F1(.)$ is false, $A$ is independent of its own value and may be computed from $B(.)$ using only set $I$.

For the remainder of the present disclosure, the feedback paths of the form in Equation 1(a) will be referred to as "monotonic loops." The term "monotonic" implies that if the loop is closed, the loop output does not change its value, or in other words, the loop output holds its previous value.

2.3 Acyclic Representation of Feedback Paths

The circuit in Equation 2 defines a semantic that when F1(.) is true, function B(.) must be false, and therefore A would holds its value. If F1(.) is false, then output signal A must be equal to B(.). This semantic may be modeled using a latch, where B(.) is the data input to the latch and the gate of the latch is controlled by the function F1(.). Since neither B(.) nor F1(.) depends upon A, the resulting circuit does not have any feedback paths from A. Therefore, using this transformation, we can convert any non-oscillating feedback path into an acyclic structure. Further below is described a methodology to determine functions F1(.) and B(.) from a gate level design. Next is described how the state-holding property of loops may be extended to multi-output loops and loops having user latches.

2.4 Feedback Loops having Multiple Outputs

In the Section 2.3, it was discussed how an equivalent circuit may be determined to compute a single output of a monotonic feedback path without any cycles. For the feedback path having multiple outputs, the remainder of the outputs may be constructed by unrolling the loop from the converted point. Consider a combinational loop having n>1 outputs. O(i) will denote the output that is converted to an acyclic path using the transformation described in Section 2.3. To generate some other feedback loop output O(j) for j different than i, the original path from O(i) to O(j) is unrolled. Since computation of O(i) does not contain any feedback, output O(j) is part of an acyclic circuit.

However, in a multiple output feedback path, the question arises as to which loop output, from the various candidate loop outputs, should be chosen to model as a state-holding element. The selected output will be denoted herein as a "breakpoint." The breakpoint is the output that is converted into a latch output. The remainder of the feedback loop is unrolled from the breakpoint. Normally there would be no restriction on which output would be chosen as breakpoint, since it would be functionally equivalent to break the feedback at any point and unroll from that point onwards to compute the remainder of the outputs. However, for those feedback path that may be nested, or contained within, one or more other feedback paths, the choice of breakpoint becomes relevant. In this case, the selection of breakpoint preferably would be such that the unrolling of the feedback would not increase the total number of loops in the design. The number of loops decreases monotonically if the breakpoint is chosen for the output that is contained within the maximum number of feedback paths in the design. This helps ensure that when the loop is unrolled to generate non-breakpoint outputs, nested or parallel loops are not duplicated. This method for selecting the breakpoint is related to the known concept of weak topological ordering. In terms of network flows, the optimal breakpoint would be the output that has the maximum flow among all other edges of the feedback path, within its SCC.

2.5 Feedback Paths with User Latches

A feedback loop may contain one or more user latches apart from combinational units. A latch has the property that it allows the input value to pass as its output value when its gate is open, otherwise it holds its previous output value. This means that the feedback loop is closed when the user latch gate is open and all other combinational units in the feedback loop are configured to close the feedback loop. In the analysis discussed in Section 2.3, F1(.) is true only when the feedback loop is closed, and therefore the outputs hold their values. To accommodate a user latch in a feedback loop, F1(.) is logically ANDed with the gate of the user latch to result in a complete state-holding condition for the loop outputs. To satisfy the condition that when the loop is closed, the output of the loop is independent of set I, i.e. it is of the form A=A, the user latch in the feedback loop would be a function of cyclic input(s) only and does not depend on non-cyclic inputs.

3.0 Illustrative Implementation Details

Figure 5:
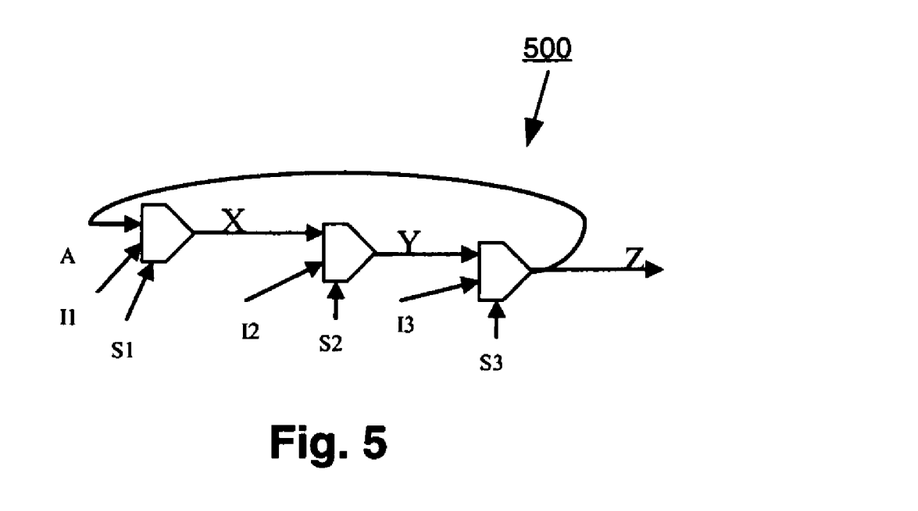
FIG. 5 is a schematic diagram of an illustrative multiplexer feedback loop.
Figure 6:
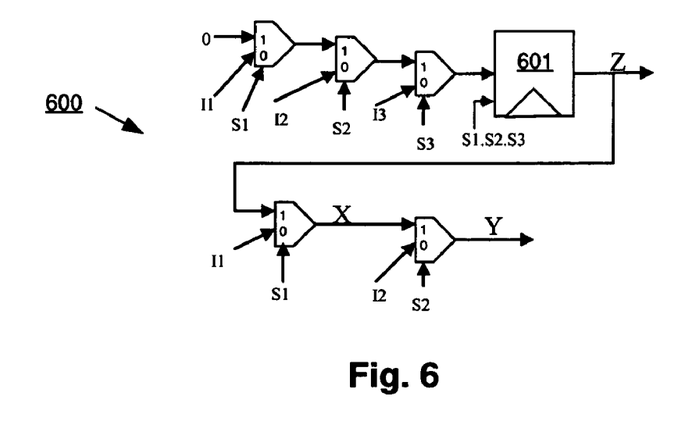
FIG. 6 is a schematic diagram of an acyclic functionally equivalent circuit for the feedback loop of FIG. 5.

In Section 2, it was shown that for a monotonic feedback loop, if F1(.) and B(.) can be determined for one of the outputs of the loop, then a circuit can be constructed to compute the breakpoint output without any feedback. The remaining outputs of the loop may be computed by unrolling the feedback path from the breakpoint. In FIGS. 5 and 6, an illustrative transformation is shown for an illustrative feedback loop 500 having only multiplexers. The pentagonal elements in FIGS. 5 and 6 each represents a multiplexer, and the rectangular box in FIG. 6 represents a latch 601 inserted to break the feedback path. A two-input multiplexer emulates the following function: if (S==1) then O=input 0, else O=input 1, wherein S represents the select for the multiplexer and O represents the output of the multiplexer. The transformed circuit 600 in FIG. 6 is equivalent to the circuit 500 in FIG. 5, since when all of the selects (i.e., S1, S2, and S3) to the multiplexers are true, then signals X, Y, and Z each holds its previous value. In FIG. 6, the gate of latch 601 is closed when all of the selects are true (i.e., the input to the gate is S1.S2.S3), forcing the output signals to hold their values. Since the loop in this example is monotonic, there is a race between different select conditions to decide the fixed point values of X, Y, and Z in the original circuit of FIG. 5. In FIG. 6, the race is arbitrarily decided in favor of signal Z. When any of the selects is false the latch is open, there is a sequence of multiplexers from the output of latch 601 in the transformed circuit that maintains the correct value of all the outputs. Assume, for example, that select S2 is false and that selects S1 and S3 are true. In this case, latch 601 is open and Z evaluates to I2. Similarly, signal X would take the value of I2 from the output of latch 601, and signal Y would select I2 from its multiplexer. In this example, the implementation is based on a functional decomposition of each element of the feedback loop into a multiplexer. However, multiplexer decomposition in the methodology is implicit.

Figure 7:
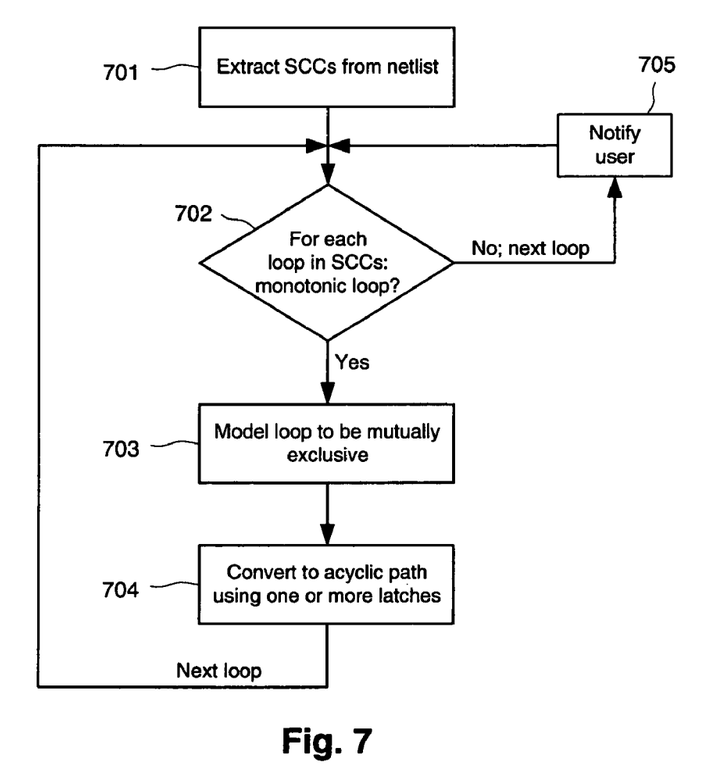
FIG. 7 is a flowchart showing an illustrative method for converting monotonic feedback loops to acyclic paths.

The methodology described thus far assumes a netlist mapped onto four-input look-up tables (LUTs). This is not a restriction, as any custom library may be mapped to equivalent four-input LUT elements. Of course, LUT elements having other than four inputs may be used. Also, non-LUT implementations may be used. Referring to FIG. 7, an illustrative method for converting monotonic feedback loops to acyclic paths is shown. In step 701, all SCCs are extracted from the netlist. This may be done using well-known methods, such as by implementing the SCC algorithm described in T. Cormen et al., "Introduction to Algorithms," The MIT Press, 2nd ed., 2001, Chapter 21. According to that algorithm, given a directed graph G(V,E) (which may be used to represent the circuit design), a maximal set of vertices $U \subseteq V$ may be found such that $\forall u,v \in U$, where u is reachable from v and v is reachable from u, using the following relationships:

$$G=(V,E) \qquad \text{Equation 3(a),}$$

$$G^T=(V,E^T), \text{ where } E^T=\{(u,v):(v,u)\in E\} \qquad \text{Equation 3(b).}$$

In Equations 3(a) and 3(b), $G^T$ refers to the transform of G. This maximal set of vertices is the set of SCCs for graph G. To determine the SCCs of the graph G, DFS(G), which is $\Theta(|V|+|E|)$, is used to compute f[u] $\forall u \in U$, and then $G^T$ would be determined. Next, DFS ($G^T$) is computed, with the requirement that in the main DFS loop, vertices are used in order of decreasing f[u] as computed from DFS(G). Finally, the vertices of each tree in the depth-first forest of the previous step are regarded to be separate SCCs.

Returning to FIG. 7, in step 702, for each feedback-loop contained in each SCC, it is determined whether that loop satisfies Equation 1(a). In other words, it is determined whether that loop is a monotonic loop by determining whether G(I) equals zero. If an SCC contains an exponentially large number of feedback paths, it is a design property and so each feedback path would be analyzed separately. If the loop being analyzed is not a monotonic loop or is at least not likely to be a monotonic loop (because G(I) is a nonzero function), then that loop is not converted and the next loop is analyzed in step 702. In addition, the user may be notified in step 705 that the loop is not monotonic and is therefore likely to be oscillatory and problematic. The notification may be made through a user interface device such as a visual notification on a computer display and/or an audible notification using a speaker. The user may find this helpful because it may signify that there is an error in the design.

However, if in step 702 the loop is confirmed to be a monotonic loop (because G(I) equals zero), then in step 703 that loop is modeled in the form of Equation 2. In other words, that loop is modeled such that function F(I), which controls the propagation of signal A to the loop output, is mutually exclusive to function B(I), which is independent of signal A. Finally, in step 704, the monotonic loops are each converted to an acyclic path using one or more state-holding elements, such as latches. In Section 3.1, the detection of monotonic feedback paths is detailed. Section 3.2 explains the transformation to an acyclic path.

3.1 Detecting Monotonic Feedback Paths

A feedback path consisting of n LUTs can be expressed as set of LUTs L(11, 12, ... 1n), and an index set M(i1, i2, ... in). The output of LUT L(i) has at least one connection to the input of LUT L(i+1), at the input index M(i+1). The net connected at M(i) is referred to as a cyclic input to LUT L(i+1).

The monotonic definition of a loop is extended to LUTs as well. A LUT L(i) is considered to be monotonic with respect to its cyclic input M(i) if there exists a function of non-cyclic inputs to LUT L(i) that would propagate the cyclic input M(i) directly or inverted to its output. In all other cases, the output is a function of non-cyclic inputs only. Essentially, the monotonic LUT is a property of the decomposition of a LUT into a two-input multiplexer, wherein both the select and one of the two inputs to the multiplexer is independent of the cyclic input.

Figure 8:
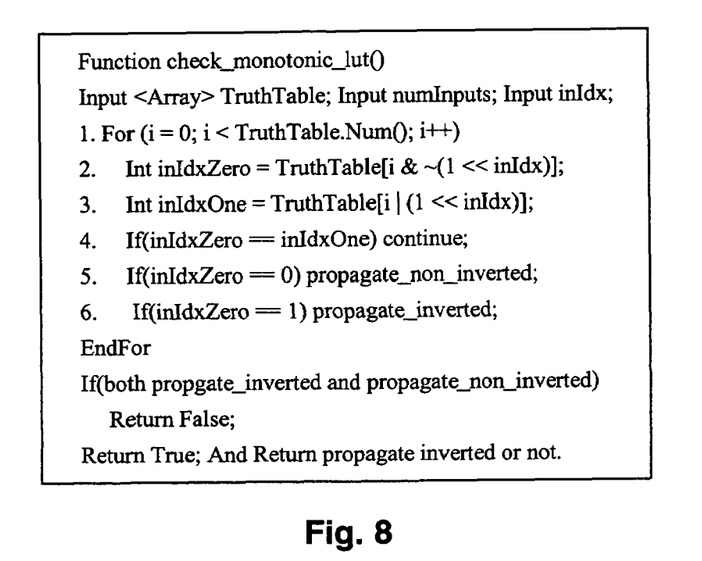
FIG. 8 depicts illustrative pseudo-code for a monotonic lookup table (LUT) checker.

FIG. 8 shows illustrative pseudo-code for a function named "check_monotonic_lut" that determines whether a LUT is monotonic. The function detects whether, whenever the cyclic input to the LUT affects the output of the LUT, the output is the same value as that of the input or always inverted. Lines 2 and 3 of the pseudo-code check for the truth table output values when the cyclic input is unmodified and when the cyclic input is flipped. The remaining inputs are unmodified. If the two output values are same, then the cyclic input does not affect the output. However, if the two output values are different, then the cyclic input affects the output. Lines 5 and 6 of the pseudo-code check whether the effect of cyclic input to the output is inverted or non-inverted, for all possible changes of cyclic input. The truth table for the select condition (i.e., the select truth table), preserving the same order of non-cyclic inputs, is the truth table bits when the cyclic input is allowed to propagate. Lines 5 and 6 of the pseudo-code update the bits of the select truth table only for those original values of the select truth table where a cyclic input affects the output. If the function returns true, then the select truth table is a valid output. It is important to note that the select condition, when computed mutually, excludes the non cyclic inputs from the cyclic input. Assuming this contradiction, it can be seen that the select condition does not allow cyclic and non-cyclic inputs to flow to the output at the same time, since the select condition for the truth table bits were determined so as to only allow cyclic input to propagate.

3.2 Computing Gate and Data logic for Latch

If all of the LUTs in set L return true for the check_monotonic_lut function described above and in FIG. 8, and if the number of inversions over all cyclic inputs is even, then the complete feedback path is of the form in Equation 1(a). In other words, this means that the complete feedback path is monotonic. This can be shown by recursively applying the LUT function on the cyclic inputs of the feedback path; the resulting function would be unate with respect to the output with non-inverted polarity. A function is unate if each of its variables appears in either its true form or its complemented form, but not both. Once the truth table is determined for all of the select functions of the LUTs, function F1(.) in Equation 2 is computed as the logical AND of the select conditions on set L, and that serves as the value-hold condition for the latch that is used to break the feedback path. The size of function F1(.) is bounded by the number of LUTs in the loop, and since each LUT would generate only one select condition, the size of the function F1(.) is linear with respect to the size of the feedback loop. This is advantageous in that the present methodology may therefore easily be scalable to larger loops.

To compute the data logic to the latch, it is observed that the input function B(.) is independent of the cyclic input. Furthermore, whenever the value of B(.) is used by the latch, the feedback of the original path is not used at all. With these observations, it is found that B(.) is nothing but the original feedback path, with the feedback disconnected at the breakpoint and the corresponding feedback input connected to ground or supply. The choice of connecting the feedback input to ground or supply is arbitrary since B(.) does not use the feedback for computing the output.

4.0 Experimental Results

The above-mentioned methodology has been implemented in C++ language to test the its performance. Table 1 presents the results obtained on various large commercial designs. As the results show, more than 99% of the loops in the designs are monotonic and are therefore convertible to acyclic paths. An interesting observation during the experiments shows that, in practice, most combinational SCCs contain approximately four or less nested loops. Non-monotonic loops are rare, probably because of possible oscillations in the circuit. The experiments were run on a 64 bit AMD OPTERON computer machine, and the CPU time reported in Table 1 includes the time to detect the SCCs in a complete design.

TABLE 1

| Design | Gate Count | Feedback Loops | Converted Loops | CPU Time (seconds) |
|---|---|---|---|---|
| Design-1 | 114,746 | 47 | 47 | 2 |
| Design-2 | 1,881,481 | 96 | 96 | 18 |
| Design-3 | 2,207,427 | 102 | 100 | 23 |
| Design-4 | 19,807,966 | 504 | 498 | 50 |
| Design-5 | 2,560,798 | 16,384 | 16,384 | 74 |

As can be seen, the linear order complexity of the methodology results in very fast execution speed. In addition, any increase in the physical area of the circuit due to loop conversion is bounded by the size of the loop. These properties enable this technique to efficiently operate on circuit designs of any size, including very large circuits having multiple feedback loops. Although the above examples do not necessarily consider gate count optimization, a logic optimizer may additionally be used to optimize the size of data and gate conditions of the latch.

There do not appear to be any published results on the execution time for combinational loop conversion that can handle multi million gate designs containing hundreds or thousands of feedback paths. Experimental results from Stephan A. Edwards, "Making Cyclic Circuits Acyclic," Proceedings of the 40th Design Automation Conference (DAC), Jun. 2-6, 2003, pop. 159-162, may be used as a reference. However, that paper reports the largest design as containing only 281 gates with an execution time to convert loops being reported as 51 seconds. In contrast, referring to Table 1 herein, in about the same time (50 seconds) we were able to both identify and convert loops in a design having nearly 20 million gates. Thus, the present technique far exceeds the performance of any previously known loop conversion techniques.

5.0 Computer Implementation

Figure 9:
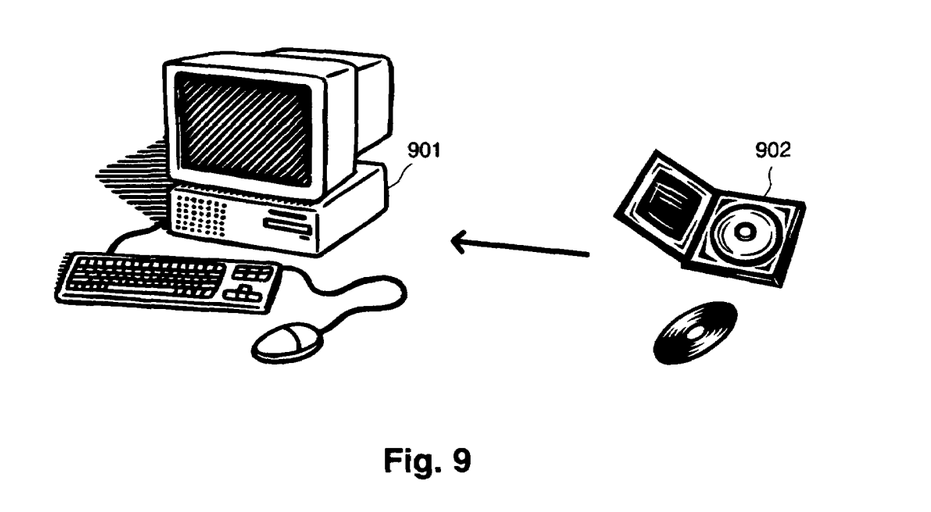
FIG. 9 depicts an illustrative computer and computer-readable medium storing computer-executable instructions, that may be used to enable aspects of the present invention to be implemented.

Referring to FIG. 9, the various embodiments as described may be partially or fully implemented on a computer such as a desktop computer 901 or a server executing computer-executable instructions stored on a computer-readable medium such as an optical compact disk 902. The computer-executable instructions may define various steps and other calculations and determinations as described herein. The term "computer-readable medium" as used herein is intended to include both any single physical information storage medium such as but not limited to a magnetic disk, an optical disk, or a memory chip, as well as a collection or other combination of any multiple physical information storage media, either of the same type or of different types. The computer-readable medium may be marketed or otherwise distributed either with or separately from the computer.

In connection with the above-discussed methodology, data representing at least a portion of a design containing one or more combinational loops may be provided to the computer or may be determined by the computer itself. In response, the computer may determine the equivalent acyclic paths that are functionally equivalent to the provided combinational loops, and output data representing the determined acyclic paths. Data communications with the computer may be made directly to the computer (e.g., by accessing a local hard drive and via keyboard input) or remotely (e.g., via a network such as the Internet). In the latter case, the computer may be a server, for example, that allows various users to implement the methodology described herein without regard to the users' physical locations relative to the computer.

6.0 Variations

The above-discussed aspects of the present invention refer to embodiments that are merely illustrative and that are not intended to limit the present invention. For example, the above-discussed illustrative embodiments reject loops that are oscillatory in nature. However, this may be modified to compute the condition that would close an otherwise oscillatory loop. Furthermore, a verification tool using this algorithm may put an explicit assertion on the loop closing condition that would fire during simulation if the loop is ever closed. This may be used as an efficient debugging aid for design-verification to detect loop oscillations.

In addition, the above-discussed methodology has been discussed in the context of emulation. However, the methodology may also be used in other contexts, such as in commercial synthesis tools as a post-synthesis step. Combinational loops created by the synthesis tools are usually non-oscillatory in nature. Loops are synthesized by the tool to match the language semantic of high level register transfer languages (RTL) such as Verilog, VHDL and System-C, etc. The methodology may therefore be used to remove the non-oscillatory loops created as a result of semantic matching by such tools.

7.0 Conclusion

A linear time methodology has been disclosed that efficiently converts non-oscillating monotonic feedback loops into acyclic paths. Experiments with real-world designs has shown that loops are usually not oscillatory since the main objective of loops is usually to hold output values based on non-cyclic inputs. The linear time complexity of the methodology allows it to be used in design tools that handle designs having many millions of gates for functional verification.

The claims appended below are illustrative and are not intended to encompass all possible claims supportable by this provisional application; other combinations and sub-combinations of the disclosed aspects and details of the present invention may be claimed in combination with or independently of the claim features recited below.

What is claimed is:

1. A method for converting a combinational loop in a circuit design into an acyclic circuit, comprising:
   sending first data representing the combinational loop; and
   receiving second data representing an acyclic path including at least one added state-holding element, the acyclic path being functionally equivalent to the combinational loop,
   wherein the second data is generated by determining whether the combinational loop is monotonic and, responsive to a determination that the combinational loop is monotonic, transforming the combinational loop into the acyclic path by adding the at least one state-holding element, and
   wherein determining whether the combinational boy is monotonic comprises
      determining a function F(I), a function G(I), and a function B(I), wherein I represents at least one non-cyclic input to the loop, such that A =(F(I) AND A) OR (G(I) AND INV(A)) OR B(I), and wherein A represents a first output of the loop,
      determining whether G(I) is zero or nonzero, and
      determining that the combinational loop is mono tonic based on a determination that G(I) is zero.

2. The method of claim 1, further including determining a Strongly Connected Component (SCC) of the design, wherein the combinational loop is contained in the SCC.

3. The method of claim 1, wherein the state-holding element is a latch.

4. The method of claim 1, wherein the combinational loop is purely combinational.

5. The method of claim 1, wherein the combinational loop comprises a plurality of combinational elements, and the acyclic path also comprises the plurality of combinational elements.

6. A computer-assisted method for converting a combinational loop in a circuit design into an acyclic circuit, comprising:

synthesizing the combinational loop from a higher-level design description using an automated synthesis tool;
determining whether the combinational loop is monotonic by:
  determining a function F(I), a function G(I), and a function B(I), wherein I represents at least one non-cyclic input to the loop, such that A =(F(I) AND A) OR (G(I) AND INV(A)) OR B(I), and wherein A represents a first output of the loop, and
  determining whether G(I) is zero or nonzero,
  determining that the combinational loop is mono tonic based on a determination that G(I) is zero; and
responsive to a determination that the combinational loop is monotonic, transforming the combinational loop into an acyclic path having at least one state-holding element.

7. The method of claim 6, wherein the combinational loop comprises a plurality of combinational elements, and the acyclic path also comprises the plurality of combinational elements.

8. A computer-readable medium storing computer-executable instructions for converting a combinational loop in a circuit design into an acyclic circuit, the instructions defining steps including:
determining whether the combinational loop is monotonic by:
  determining a function F(I), a function G(I), and a function B(I), wherein I represents at least one non-cyclic input to the loop, such t at A =(F(I) AND A) OR (G(I) AND INV(A)) OR B(I), and wherein A represents a first output of the loop,
  determining whether G(I) is zero or nonzero,
  determining that the combinational loop is monotonic based on a determination that G(I) is zero; and
responsive to a determination that the combinational loop is monotonic, transforming the combinational loop into an acyclic path by adding at least one state-holding element.

9. The computer-readable medium of claim 8, wherein the combinational loop has a plurality of outputs including the first output, and wherein the instructions further define a step of choosing the first output to be that output that is contained in the maximum number of feedback paths in the design.

10. The computer-readable medium of claim 8, wherein the step of transforming includes defining a value-hold condition of the state-holding element as being F(I) AND INV(B(I)).

11. The computer-readable medium of claim 8, wherein the state-holding element is a latch.

12. The computer-readable medium method of claim 8, wherein the instructions further define a step of notifying a user responsive to a determination that the combinational loop is not monotonic.

13. The computer-readable medium of claim 8, wherein the instructions further define a step of determining a Strongly Connected Component (SCC) of the design, wherein the combinational loop is contained in the SCC.

14. The computer-readable medium of claim 8, wherein the combinational loop is purely combinational.

15. The computer-readable medium of claim 8, wherein the combinational loop comprises a plurality of combinational elements, and the acyclic path also comprises the plurality of combinational elements.

* * * * *

UNITED STATES PATENT AND TRADEMARK OFFICE
CERTIFICATE OF CORRECTION

PATENT NO.          : 7,454,722 B2
APPLICATION NO.  : 11/068036
DATED                  : November 18, 2008
INVENTOR(S)       : Amit Gupta et al.

Page 1 of 1

It is certified that error appears in the above-identified patent and that said Letters Patent is hereby corrected as shown below:

In Column 10, Claim 1, Line 43:
    Please delete "boy" and insert --loop--

In Column 10, Claim 1, Line 52:
    Please delete "mono tonic" and insert --monotonic--

In Column 11, Claim 6, Line 12:
    Please delete "mono tonic" and insert --monotonic--

In Column 11, Claim 8, Line 30:
    Please delete "t at" and insert --that--

Signed and Sealed this

Twenty-first Day of July, 2009

JOHN DOLL
*Acting Director of the United States Patent and Trademark Office*